United States Patent
Chen et al.

(10) Patent No.: US 9,455,341 B2
(45) Date of Patent: Sep. 27, 2016

(54) TRANSISTOR HAVING A BACK-BARRIER LAYER AND METHOD OF MAKING THE SAME

(71) Applicant: TAIWAN SEMICONDUCTOR MANUFACTURING COMPANY, LTD., Hsinchu (TW)

(72) Inventors: Chi-Ming Chen, Zhubei (TW); Chih-Wen Hsiung, Hsinchu (TW); Po-Chun Liu, Hsinchu (TW); Ming-Chang Ching, Zhubei (TW); Chung-Yi Yu, Hsinchu (TW); Xiaomeng Chen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/944,672

(22) Filed: Jul. 17, 2013

(65) Prior Publication Data
US 2015/0021660 A1   Jan. 22, 2015

(51) Int. Cl.
*H01L 29/778* (2006.01)
*H01L 29/66* (2006.01)
*H01L 29/20* (2006.01)

(52) U.S. Cl.
CPC ..... *H01L 29/7783* (2013.01); *H01L 29/66462* (2013.01); *H01L 29/2003* (2013.01)

(58) Field of Classification Search
USPC ........................................................ 257/190
See application file for complete search history.

(56) References Cited

U.S. PATENT DOCUMENTS

| | | | |
|---|---|---|---|
| 5,352,909 A * | 10/1994 | Hori ................................. 257/76 |
| 5,567,961 A * | 10/1996 | Usagawa ............ H01L 27/0605 257/192 |
| 6,133,593 A * | 10/2000 | Boos .................. H01L 29/1029 257/194 |
| 7,112,830 B2 | 9/2006 | Munns |
| 7,547,925 B2 | 6/2009 | Wong et al. |
| 2005/0051796 A1* | 3/2005 | Parikh ................... H01L 29/812 257/192 |
| 2007/0108456 A1 | 5/2007 | Wong et al. |
| 2008/0258150 A1* | 10/2008 | McCarthy et al. ............. 257/76 |
| 2009/0045438 A1* | 2/2009 | Inoue ................... H01L 29/155 257/192 |

(Continued)

OTHER PUBLICATIONS

Srivastava, P., et al., "Si Trench Around Drain (STAD) Technology of GaN-DHFETs on Si Substrate for Boosting Power Performance", IEEE, 2001.

*Primary Examiner* — Zandra Smith
*Assistant Examiner* — Lawrence Tynes, Jr.
(74) *Attorney, Agent, or Firm* — Hauptman, Ham, LLP

(57) ABSTRACT

A transistor includes a substrate and a buffer layer on the substrate, wherein the buffer layer comprises p-type dopants. The transistor further includes a channel layer on the buffer layer and a back-barrier layer between a first portion of the channel layer and a second portion of the channel layer. The back-barrier layer has a band gap discontinuity with the channel layer. The transistor further includes an active layer on the second portion of the channel layer, wherein the active layer has a band gap discontinuity with the second portion of the channel layer. The transistor further includes a two dimensional electron gas (2-DEG) in the channel layer adjacent an interface between the channel layer and the active layer.

20 Claims, 7 Drawing Sheets

(56) References Cited

U.S. PATENT DOCUMENTS

| | | | |
|---|---|---|---|
| 2010/0012977 A1* | 1/2010 | Derluyn | H01L 29/2003 257/194 |
| 2010/0117118 A1* | 5/2010 | Dabiran | H01L 29/207 257/190 |
| 2011/0278644 A1* | 11/2011 | Gao | H01L 29/7786 257/190 |
| 2011/0297961 A1* | 12/2011 | Bunin | H01L 29/42316 257/76 |
| 2013/0248933 A1* | 9/2013 | Ikeda | H01L 29/7786 257/194 |
| 2014/0239309 A1* | 8/2014 | Ramdani et al. | 257/76 |

* cited by examiner

TRANSISTOR HAVING A BACK-BARRIER LAYER AND METHOD OF MAKING THE SAME

RELATED APPLICATIONS

The instant application is related to the following U.S. Patent Applications:

U.S. patent application Ser. No. 13/944,779, filed Jul. 17, 2013, titled "TRANSISTOR HAVING PARTIALLY OR WHOLLY REPLACED SUBSTRATE AND METHOD OF MAKING THE SAME";

U.S. patent application Ser. No. 13/944,713, filed Jul. 17, 2013, now U.S. Pat. No. 9,093,511, issued Jul. 25, 2015, titled "TRANSISTOR HAVING HIGH BREAKDOWN VOLTAGE AND METHOD OF MAKING THE SAME";

U.S. patent application Ser. No. 13/944,584, filed Jul. 17, 2013, titled "TRANSISTOR HAVING BACK-BARRIER LAYER AND METHOD OF MAKING THE SAME";

U.S. patent application Ser. No. 13/944,494, filed Jul. 17, 2013, now U.S. Pat. No. 8,901,609, issued Dec. 2, 2014, titled "TRANSISTOR HAVING DOPED SUBSTRATE AND METHOD OF MAKING THE SAME";

U.S. patent application Ser. No. 14/010,268, filed Aug. 26, 2013, now U.S. Pat. No. 8,975,641, issued Mar. 10, 2015, titled "TRANSISTOR HAVING OHMIC CONTACT BY GRADIENT LAYER AND METHOD OF MAKING SAME";

U.S. patent application Ser. No. 14/010,220, filed Aug. 26, 2013, now U.S. Pat. No. 8,969,882, issued Mar. 3, 2015, titled "TRANSISTOR HAVING AN OHMIC CONTACT BY SCREEN LAYER AND METHOD OF MAKING THE SAME";

U.S. patent application Ser. No. 13/948,925, filed Jul. 23, 2013, titled "TRANSISTOR HAVING METAL DIFFUSION BARRIER AND METHOD OF MAKING THE SAME"; and U.S. patent application Ser. No. 13/944,625, filed Jul. 17, 2013, now U.S. Pat. No. 8,866,192, issued Oct. 21, 2015, titled "SEMICONDUCTOR DEVICE, HIGH ELECTRON MOBILITY TRANSISTOR (E-HEMT) AND METHOD OF MANUFACTURING".

The entire contents of the above-referenced applications are incorporated by reference herein.

BACKGROUND

In semiconductor technology, Group III-Group V (or III-V) semiconductor compounds are used to form various integrated circuit devices, such as high power field-effect transistors, high frequency transistors, high electron mobility transistors (HEMTs), or metal-insulator-semiconductor field-effect transistors (MISFETs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies, etc. In some HEMTs, a buffer layer is doped with p-type dopants to reduce electrons from the substrate being injected into the channel layer. In some instances, diffusion of the p-type dopants over time degrades the channel of the HEMT by removing electrons as charge carriers from the channel.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
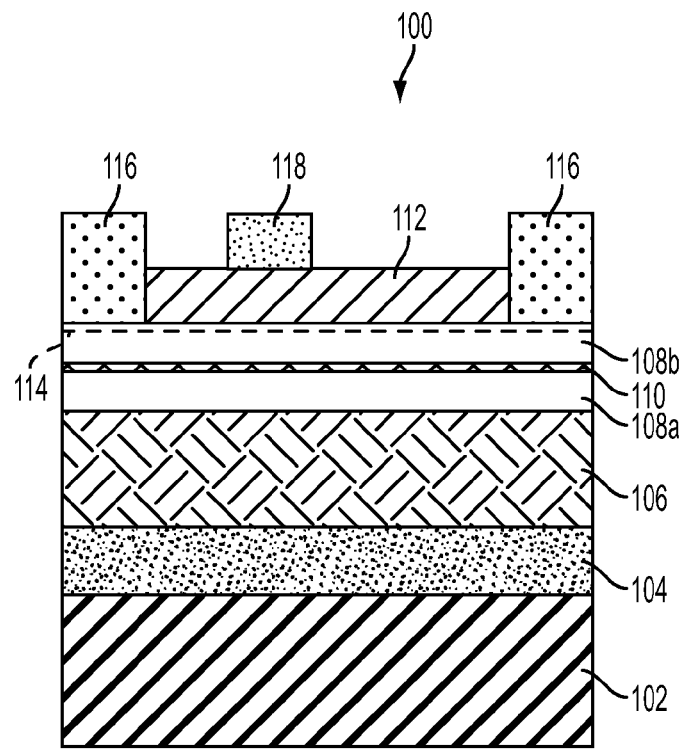
FIG. 1 is a cross-sectional view of a high electron mobility transistor (HEMT) having a back-barrier layer in accordance with one or more embodiments.

FIG. 1 is a cross-sectional view of a high electron mobility transistor (HEMT) 100 having a back-barrier layer 110 in accordance with one or more embodiments. HEMT 100 includes a substrate 102. A nucleation layer 104 is over substrate 102. In some embodiments, nucleation layer 104 includes multiple layers, such as seed layers and/or graded layers. A buffer layer 106 is over nucleation layer 104. Buffer layer 106 is doped with p-type dopants. A first portion 108a of a channel layer is over buffer layer 106. Back-barrier layer 110 is over first portion 108a of the channel layer. A second portion 108b of the channel layer is over back-barrier layer 110. An active layer 112 is over second portion 108b of the channel layer. Due to a band gap discontinuity between second portion 108b of the channel and active layer 112, a two dimension electron gas (2-DEG) 114 is formed in the second portion of the channel layer near an interface with the active layer. Electrodes 116 are over second portion 108b of the channel layer and a gate 118 is over active layer 112 between the electrodes.

Substrate 102 acts as a support for HEMT 100. In some embodiments, substrate 102 is a silicon substrate. In some embodiments, substrate 102 includes silicon carbide (SiC), sapphire, or another suitable substrate material. In some embodiments, substrate 102 is a silicon substrate having a (111) lattice structure.

Nucleation layer 104 helps to compensate for a mismatch in lattice structures between substrate 102 and buffer layer 106. In some embodiments, nucleation layer 104 includes multiple layers. In some embodiments, nucleation layer 104 includes a same material formed at different temperatures. In some embodiments, nucleation layer 104 includes a stepwise change in lattice structure. In some embodiments, nucleation layer 104 includes a continuous change in lattice structure. In some embodiments, nucleation layer 104 is formed by epitaxially growing the nucleation layer on substrate 102.

In at least one example, nucleation layer 104 comprises a first layer of aluminum nitride (AlN), a second layer of AlN over the first layer of AlN and a graded layer over the second layer of AlN. The first layer of AlN is formed at a low temperature, ranging from about 900° C. to about 1000° C., and has a thickness ranging from about 20 nanometers (nm) to about 80 nm. If the thickness of the first layer of AlN is too small, subsequent layers formed on the first layer of AlN will experience a high stress at the interface with the first AlN layer due to lattice mismatch increasing a risk of layer separation. If the thickness of the first layer of AlN is too great, the material is wasted and production costs increase. The second layer of AlN is formed at a high temperature, ranging from about 1000° C. to about 1300° C., and has a thickness ranging from about 50 nm to about 200 nm. The higher temperature provides a different lattice structure in the second AlN layer in comparison with the first AlN layer. The lattice structure in the second AlN layer is more different from a lattice structure of substrate 102 than the first AlN layer. If the thickness of the second layer of AlN is too small, subsequent layers formed on the second layer of AlN will experience a high stress at the interface with the second layer of AlN due to lattice mismatch increasing the risk of layer separation. If the thickness of the second layer of AlN is too great, the material is wasted and production costs increase.

The graded layer includes aluminum gallium nitride ($Al_xGa_{1-x}N$) and is formed over the second AlN layer. X is the aluminum content ratio in the graded layer. In some embodiments, the graded layer includes multiple layers each having a decreased ratio x (from a layer adjoining the second AlN layer to a layer that adjoins buffer layer 106, or from the bottom to the top portions of the graded layer). In at least one embodiment, the graded aluminum gallium nitride layer has four layers whose ratios x are 0.9, 0.7, 0.6, and 0.5, from the bottom to the top. In some embodiments, instead of having multiple layers, the graded layer has a continuous gradient of the x value. In some embodiments, x ranges from about 0.9 to about 0.5. In some embodiments, graded layer has a thickness ranging from about 50 nm to about 200 nm. If the graded layer is too thin, buffer layer 106 will have a high stress at an interface with nucleation layer 104 and increase the risk of separation between the buffer layer and the nucleation layer. If the graded layer is too thick, material is wasted and production costs increase. In some embodiments, the graded layer is formed at a temperature ranging from about 1000° C. to about 1200° C.

In some embodiments, nucleation layer 104 is omitted, and thus buffer layer 106 is directly on substrate 102.

Buffer layer 106 provides a p-type doped layer to reduce electron injection from substrate 102. Electron injection occurs when electrons from substrate 102 diffuse into the channel layer. By including p-type dopants in buffer layer 106, the electrons are trapped by the buffer layer and do not negatively impact performance of 2-DEG 114 in the channel layer. In some embodiments, buffer layer 106 includes gallium nitride (GaN) doped with p-type dopants. In some embodiments, the p-type dopants include carbon, iron, magnesium, zinc or other suitable p-type dopants. In some embodiments, a concentration of the p-type dopant is greater than or equal to about $1 \times 10^{19}$ ions/cm$^3$. If the p-type dopant concentration is too low, buffer layer 106 will not be able to effectively prevent electron injection from substrate 102. If the p-type dopant concentration is too high, p-type dopants will diffuse into the channel layer and negatively impact 2-DEG 114. In some embodiments, buffer layer 106 is formed using an epitaxial process. In some embodiments, buffer layer 106 is formed at a temperature ranging from about 1000° C. to about 1200° C. In some embodiments, buffer layer 106 has a thickness ranging from about 0.5 microns (μm) to about 5.0 μm. If buffer layer 106 is too thin, the buffer layer 106 will not be able to effectively prevent electron injection from substrate 102. If buffer layer 106 is too thick, the amount of p-type dopants will negatively impact the performance of the channel layer by attracting electrons away from 2-DEG 114.

First portion 108a of the channel layer is used to help form a conductive path for selectively connecting electrodes 116. In some embodiments, first portion 108a of the channel layer includes GaN. In some embodiments, first portion 108a of the channel layer has a p-type dopant concentration of equal to or less than $1 \times 10^{17}$ ions/cm$^3$. In some embodiments, first portion 108a of the channel layer is an undoped layer or an unintentionally doped layer. In some embodiments, first portion 108a of the channel layer has a thickness ranging from about 0.1 μm to about 0.5 μm. In at least one example, first portion 108a of the channel layer has a thickness of 0.25 μm. If a thickness of first portion 108a of the channel layer is too thin, the first portion will not provide sufficient charge carriers to allow HEMT 100 to function properly. If the thickness of first portion 108a of the channel layer is too great, material is wasted and production costs increase. In some embodiments, first portion 108a of the channel layer is formed by an epitaxial process. In some embodiments, first portion 108a of the channel layer is formed at a temperature ranging from about 1000° C. to about 1200° C.

Back-barrier layer 110 helps to prevent dopants from buffer layer 106 from diffusing through the channel layer to impact the performance of 2-DEG 114. Back-barrier layer 110 has a band gap discontinuity with respect to first portion 108a of the channel layer. The band gap discontinuity acts to prevent the p-type dopants of buffer layer 106 from passing an interface of back-barrier layer 110 and first portion 108a of the channel layer. As a result, a dopant concentration in buffer layer 106 is able to be increased to provide better electron injection prevention with a reduced risk of the dopants negatively impacting 2-DEG 114.

Figure 2:
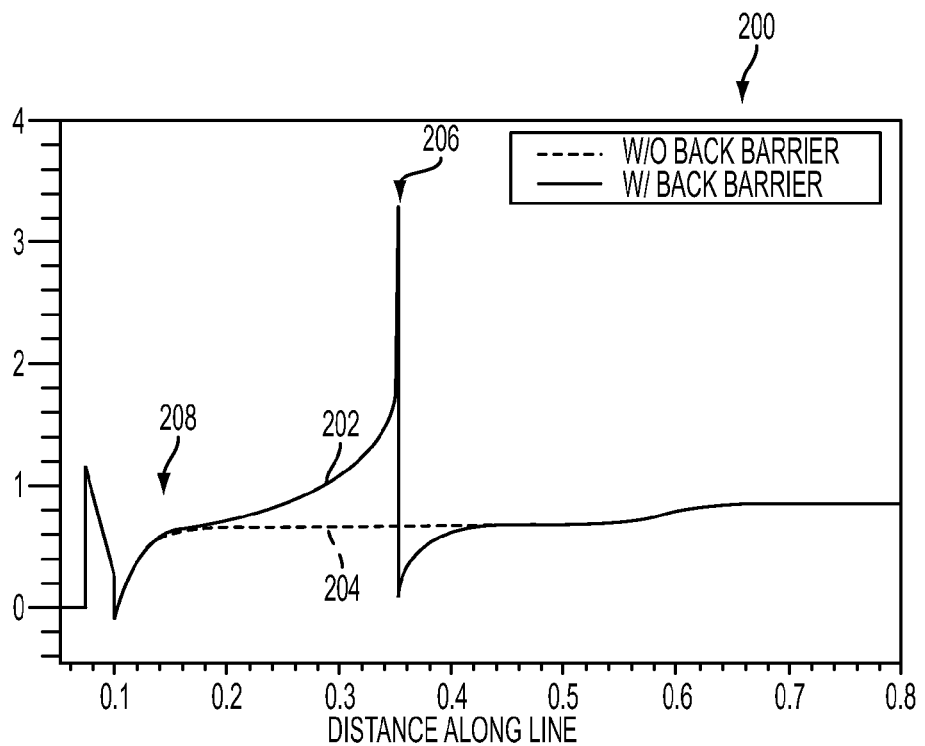
FIG. 2 is a band diagram of an HEMT having a back-barrier layer and of an HEMT without a back-barrier layer in accordance with one or more embodiments.

FIG. 2 is a band diagram 200 of an HEMT having a back-barrier layer and of an HEMT without a back-barrier layer in accordance with one or more embodiments. Band diagram 200 indicates electron levels versus a depth into the HEMT. Band diagram 200 indicates a band gap 202 of an HEMT including a back-barrier layer, e.g., back-barrier layer 110. Band diagram 200 indicates a band gap 204 of an HEMT without a back-barrier layer. Band gap 202 indicates a discontinuity 206 at an interface of a portion of the channel layer and the back-barrier layer. Discontinuity 206 helps to prevent dopants from a buffer layer, e.g., buffer layer 106, (located to the right in band diagram 200) from diffusing into the channel layer to negatively impact a 2-DEG 208. In contrast, band gap 204 indicates no discontinuity and provides a reduced resistance to diffusion of dopants from the buffer layer toward 2-DEG 208.

Returning to FIG. 1, in some embodiments, back-barrier layer 110 is formed by an epitaxial process. In some embodiments, back-barrier layer 110 is formed at a temperature ranging from about 1000° C. to about 1200° C.

In some embodiments, back-barrier layer 110 includes AlN. In some embodiments, back-barrier layer 110 includes a mixed structure, such as $Al_xGa_{1-x}N$, indium aluminum nitride ($In_yAl_{1-y}N$). In some embodiments, x ranges from about 0.1 to about 0.9. In some embodiments, y is greater than or equal to 0.5. In some embodiments, back-barrier layer 110 includes a complex structure including a combination of AlN and a mixed structure or a combination of two mixed structures. In some embodiments where back-barrier layer 110 includes AlN, the back-barrier layer has a thickness ranging from about 1 nm to about 6 nm. In some embodiments where back-barrier layer includes $Al_xGa_{1-x}N$, the back-barrier layer has a thickness ranging from about 0.1 nm to about 20 nm. In some embodiments where back-barrier layer includes $In_yAl_{1-y}N$, the back-barrier layer has a thickness ranging from about 0.1 nm to about 20 nm. If the thickness of back-barrier layer 110 is too great, a 2-DEG will form between the back-barrier layer and first portion 108a of the channel layer. The 2-DEG will attract dopants from buffer layer 106, in some instances, which will reduce the effectiveness of the buffer layer from preventing electron injection. If the thickness of back-barrier layer 110 is too small, the back-barrier layer will not provide sufficient protection from dopants diffusion through the channel layer.

Second portion 108b of the channel layer is used to form a conductive path for selectively connecting electrodes 116. Second portion 108b of the channel layer is similar to first portion 108a. In some embodiments, second portion 108b of the channel layer has a same thickness as the first portion 108a. In some embodiments, second portion 108b of the channel layer has a different thickness from the first portion 108a. In some embodiments, second portion 108b of the channel layer has a same dopant concentration as the first portion 108a. In some embodiments, second portion 108b of the channel layer has a different dopant concentration from the first portion 108a.

Active layer 112 is used to provide the band gap discontinuity with the channel layer to form 2-DEG 114. In some embodiments, active layer 112 includes AlN. In some embodiments, active layer 112 includes a mixed structure, e.g., $Al_xGa_{1-x}N$, where x ranges from about 0.1 to 0.3. In some embodiments, active layer 112 includes both AlN and the mixed structure. In some embodiments, active layer 112 has a thickness ranging from about 10 nm to about 40 nm. In some embodiments where active layer 112 includes an AlN layer and a mixed structure layer, a thickness of the AlN layer ranges from about 0.5 nm to about 1.5 nm and a thickness of the mixed structure layer ranges from about 10 nm to about 40 nm. If active layer 112 is too thick, selectively controlling the conductivity of the channel layer is difficult. If active layer 112 is too thin, an insufficient amount of electrons are available for 2-DEG 114. In some embodiments, active layer 112 is formed using an epitaxial process. In some embodiments, active layer 112 is formed at a temperature ranging from about 1000° C. to about 1200° C.

2-DEG 114 acts as the channel for providing conductivity between electrodes 116. Electrons from a piezoelectric effect in active layer 112 drop into the channel layer, and thus create a thin layer of highly mobile conducting electrons in the channel layer.

Electrodes 116 act as a source and a drain for HEMT 100 for transferring a signal into or out of the HEMT. Gate 118 helps to modulate conductivity of 2-DEG 114 for transferring the signal between electrodes 116.

HEMT 100 is normally conductive meaning that a positive voltage applied to gate 118 will reduce the conductivity between electrodes 116 along 2-DEG 114.

HEMT 100 includes a single back-barrier layer 110. In some embodiments, multiple back-barrier layers are provided in the channel layer to provide greater protection from dopants diffusing into 2-DEG 114.

Figure 3:
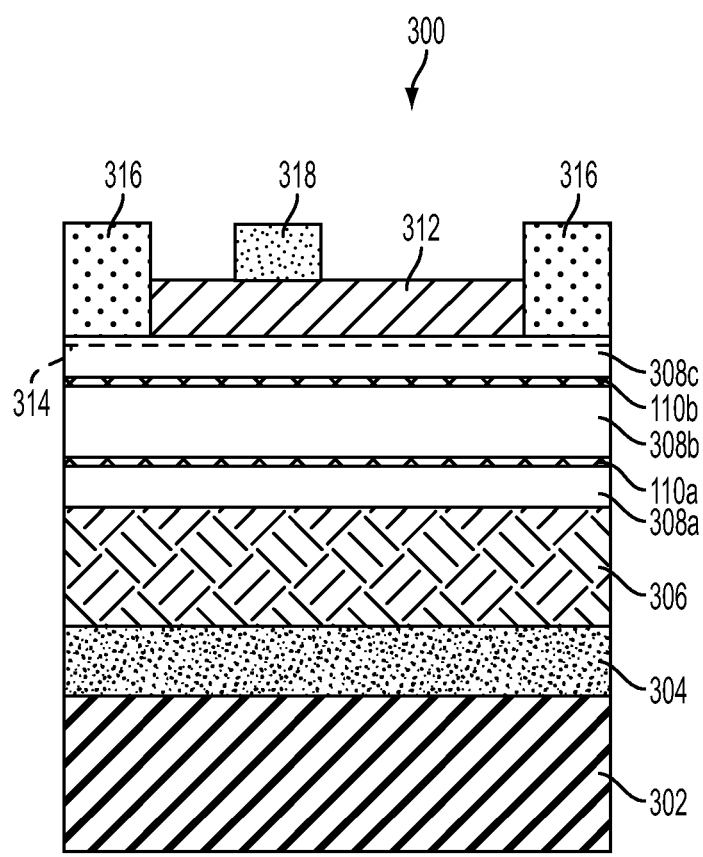
FIG. 3 is a cross-sectional view of a HEMT having multiple back-barrier layers in accordance with one or more embodiments.

FIG. 3 is a cross-sectional view of a HEMT 300 having multiple back-barrier layers in accordance with one or more embodiments. HEMT 300 is similar to HEMT 100. Similar elements have a same reference number as HEMT 100 increased by 200. In comparison with HEMT 100, HEMT 300 includes a first back-barrier layer 310a and a second back-barrier layer 310b. HEMT 300 also includes a channel layer separated into a first portion 308a, a second portion 308b and a third portion 308c. In some embodiments, a number of back-barrier layers is greater than two. In some embodiments, the number of back-barrier layer is twenty or more. In some embodiments, a thickness of each portion 308a, 308b and 308c of the channel layer is similar to the thickness of the first portion 108a and second portion 108b of HEMT 100, resulting in an overall increase in thickness of HEMT 300 in comparison with HEMT 100.

Figure 4:
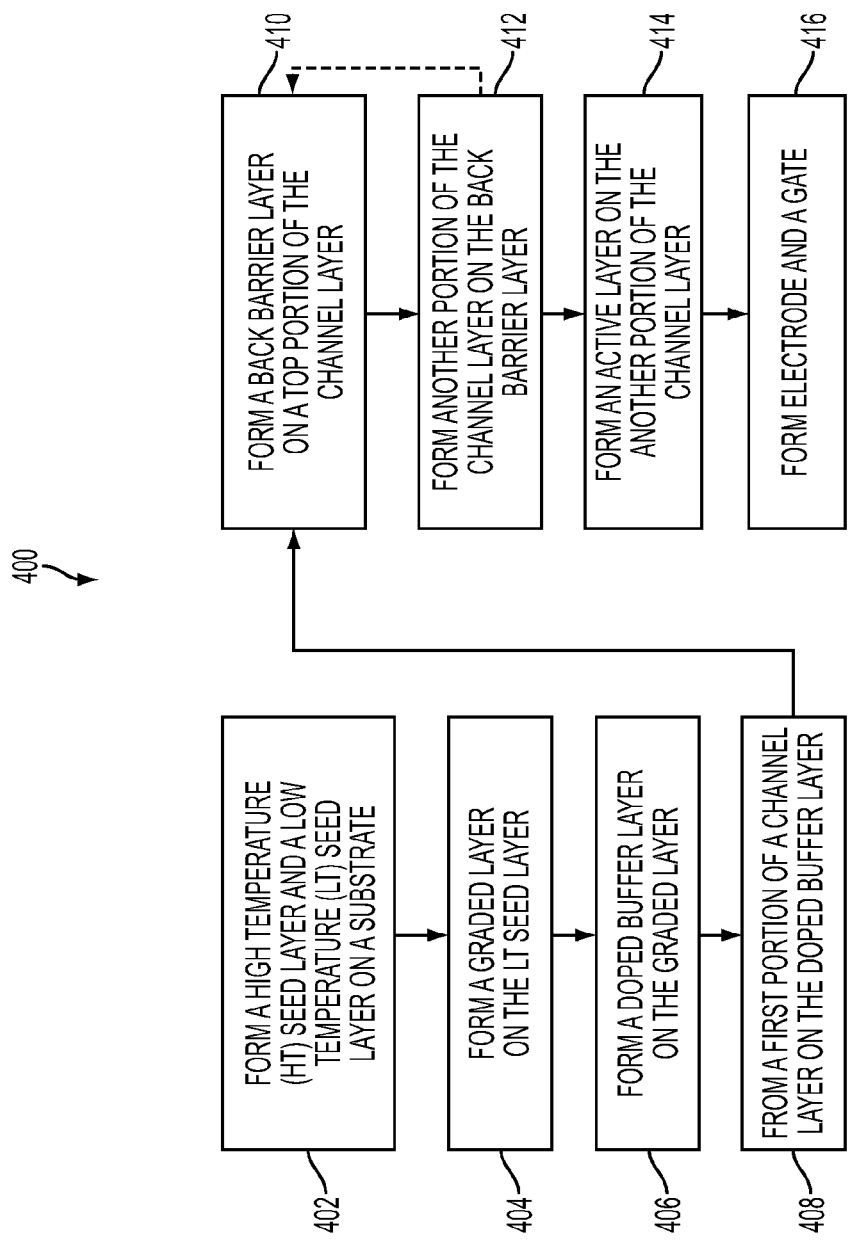
FIG. 4 is a flow chart of a method of making an HEMT having a back-barrier layer in accordance with one or more embodiments.

FIG. 4 is a flow chart of a method 400 of making an HEMT having a back-barrier layer in accordance with one or more embodiments. Method 400 begins with operation 402 in which a low temperature (LT) seed layer and a high temperature (HT) seed layer are formed on a substrate, e.g., substrate 102. The LT seed layer is formed on the substrate and the HT seed layer is formed on the LT seed layer.

In some embodiments, LT seed layer and HT seed layer include AlN. In some embodiments, the formation of LT seed layer and HT seed layer are performed by an epitaxial growth process. In some embodiments, the epitaxial growth process includes a metal-organic chemical vapor deposition (MOCVD) process, a molecular beam epitaxy (MBE) process, a hydride vapor phase epitaxy (HVPE) process or another suitable epitaxial process. In some embodiments, the MOCVD process is performed using aluminum-containing precursor and nitrogen-containing precursor. In some embodiments, the aluminum-containing precursor includes trimethylaluminium (TMA), triethylaluminium (TEA), or other suitable chemical. In some embodiments, the nitrogen-containing precursor includes ammonia, tertiarybutylamine (TBAm), phenyl hydrazine, or other suitable chemical. In some embodiments, the LT seed layer or the HT seed layer includes a material other than AlN. In some embodiments, the HT seed layer has a thickness ranging from about 50 nm to about 200 nm. In some embodiments, the HT seed layer is formed at a temperature ranging from about 1000° C. to about 1300° C. In some embodiments, the LT seed layer had a thickness ranging from about 20 nm to about 80 nm. In some embodiments, the LT seed layer is formed at a temperature ranging from about 900° C. to about 1000° C.

Method 400 continues with operation 404 in which a graded layer is formed on the LT seed layer. In some embodiments, the graded layer includes an aluminum-gallium nitride ($Al_xGa_{1-x}N$) layer. In some embodiments, the graded aluminum gallium nitride layer has two or more aluminum-gallium nitride layers each having a different ratio x decreased from the bottom to the top. In some embodiments, each of the two or more aluminum-gallium nitride layers is formed by performing an epitaxial process. In some embodiments, the epitaxial process includes a MOCVD process, a MBE process, a HVPE process or another suitable epitaxial process. In some embodiments, the MOCVD process uses an aluminum-containing precursor, a gallium-containing precursor, and a nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical. In some embodiments, the graded aluminum gallium nitride layer has a continuous gradient of the ratio x gradually decreased from the bottom to the top. In some embodiments, x ranges from about 0.5 to about 0.9. In some embodiments, the transition layer 130 has a thickness ranging from about 50 nm to about 200 nm. In some embodiments, the graded layer is formed at a temperature ranging from about 1000° C. to about 1200° C.

Method 400 continues with operation 406 in which a doped buffer layer is formed on the graded layer. In some embodiments, the doped buffer layer includes p-type dopants. In some embodiments, the doped buffer layer includes GaN, and the P-type doping is implemented by using dopants including carbon, iron, magnesium, zinc or other suitable p-type dopants. In some embodiments, the doped buffer layer is formed by performing an epitaxial process. In some embodiments, the epitaxial process includes a MOCVD process, a MBE process, a HVPE process or another suitable epitaxial process. In some embodiments, the doped buffer layer has a thickness ranging from about 0.5 µm to about 5.0 µm. In some embodiments, the dopant concentration in the doped buffer layer is equal to or greater than about $1 \times 10^{19}$ ions/cm³. In some embodiments, the doped buffer layer is formed at a temperature ranging from about 1000° C. to about 1200° C.

Figure 5A:
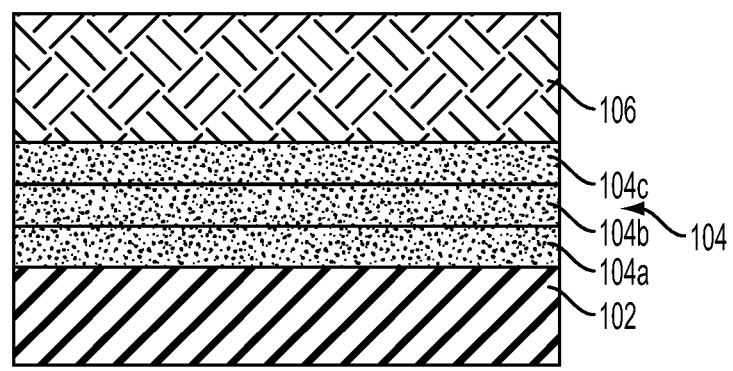
FIGS. 5A-5E are cross-sectional view of a HEMT having a back-barrier layer at various stages of production in accordance with one or more embodiments.

FIG. 5A is a cross-sectional view of a HEMT following operation 406 in accordance with one or more embodiments. The HEMT includes substrate 102 and nucleation layer 104 on the substrate. Nucleation layer 104 includes an LT seed layer 104a on substrate 102, a HT seed layer 104b on the LT seed layer and a graded layer 104c on the HT seed layer. Buffer layer 106 is on graded layer 104c. For the sake of simplicity, nucleation layer 104 is depicted as a single layer in the following cross-sectional views.

Returning to FIG. 4, in operation 408 a first portion of a channel layer is formed on the doped buffer layer. In some embodiments, the first portion of the channel layer includes p-type dopants. In some embodiments, the first portion of the channel layer includes GaN, and the P-type doping is implemented by using dopants including carbon, iron, magnesium, zinc or other suitable p-type dopants. In some embodiments, the first portion of the channel layer is formed by performing an epitaxial process. In some embodiments, the epitaxial process includes a MOCVD process, a MBE process, a HVPE process or another suitable epitaxial process. In some embodiments, the first portion of the channel layer has a thickness ranging from about 0.1 µm to about 0.5 µm. In some embodiments, the dopant concentration in the first portion of the channel layer is equal to or less than about $1 \times 10^{17}$ ions/cm³. In some embodiments, the first portion of the channel layer is formed at a temperature ranging from about 1000° C. to about 1200° C.

Figure 5B:
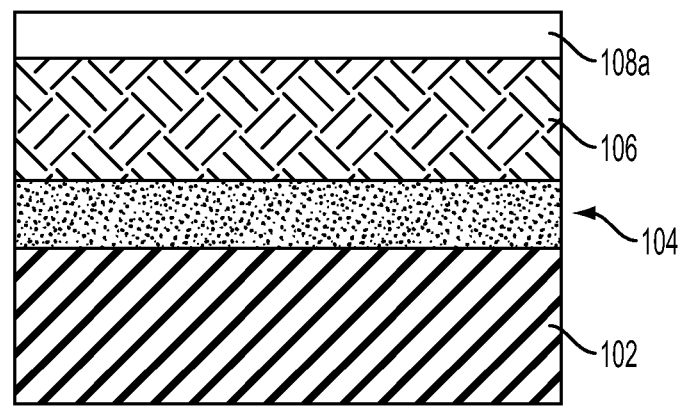

FIG. 5B is a cross-sectional view of a HEMT following operation 408 in accordance with one or more embodiments. The HEMT includes first portion 108a of the channel layer on buffer layer 106.

Returning to FIG. 4, in operation 410 a back-barrier layer is formed on a top portion of the channel layer. In some embodiments, the back-barrier layer includes AlN, $Al_xGa_{1-x}N$, $In_yAl_{1-y}N$, combinations thereof or other suitable materials. In some embodiments, the back-barrier layer is formed by performing an epitaxial process. In some embodiments, the epitaxial process includes a MOCVD process, a MBE process, a HVPE process or another suitable epitaxial process. In some embodiments, the back-barrier layer has a thickness ranging from about 1 nm to about 6 nm. In some embodiments, the back-barrier layer has a thickness ranging from about 0.1 nm to about 20 nm. In some embodiments, the back-barrier layer is formed at a temperature ranging from about 1000° C. to about 1200° C.

Figure 5C:
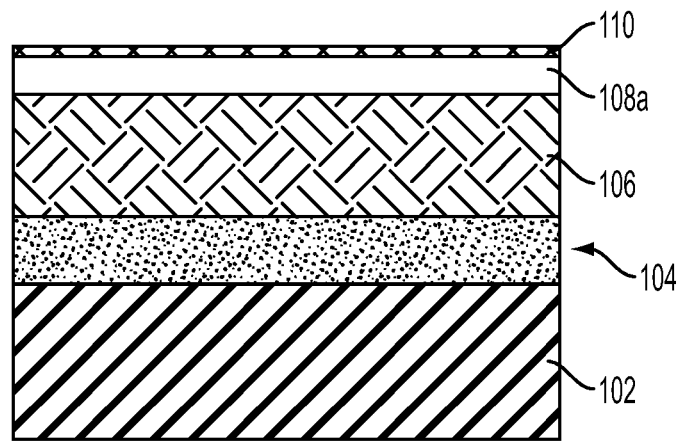

FIG. 5C is a cross-sectional view of a HEMT following operation 410 in accordance with one or more embodiments. The HEMT includes back-barrier layer 110 on first portion 108a of the channel layer.

Returning to FIG. 4, in operation 412 another portion of the channel layer is formed on the back-barrier layer. In some embodiments, the other portion of the channel layer includes p-type dopants. In some embodiments, the other portion of the channel layer includes GaN, and the P-type doping is implemented by using dopants including carbon, iron, magnesium, zinc or other suitable p-type dopants. In some embodiments, the other portion of the channel layer is formed by performing an epitaxial process. In some embodiments, the epitaxial process includes a MOCVD process, a MBE process, a HVPE process or another suitable epitaxial process. In some embodiments, the other portion of the channel layer has a thickness ranging from about 0.1 µm to about 0.5 µm. In some embodiments, the dopant concentration in the other portion of the channel layer is equal to or less than about $1 \times 10^{17}$ ions/cm³. In some embodiments, the other portion of the channel layer is formed at a temperature ranging from about 1000° C. to about 1200° C. In some embodiments, following operation 412 method 400 repeats operation 410 to form an additional back-barrier layer. In some embodiments, operations 410 and 412 are repeated multiple times to form multiple back-barrier layers.

Figure 5D:
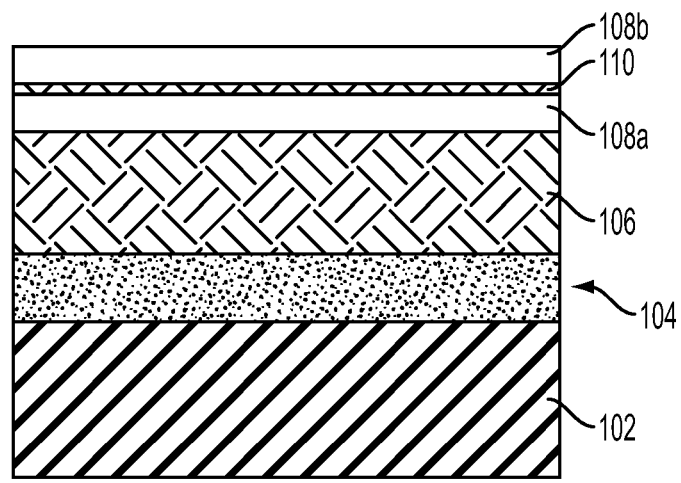

FIG. 5D is a cross-sectional view of a HEMT following operation 412 in accordance with one or more embodiments. The HEMT includes second portion 108b of the channel layer on back-barrier layer 110.

Returning to FIG. 4, in operation 414 an active layer is formed on the other portion of the channel layer. In some embodiments, the active layer includes AlN, $Al_xGa_{1-x}N$, combinations thereof or other suitable materials. In some embodiments, x ranges from about 0.1 to about 0.3. In some embodiments, the active layer is formed by performing an epitaxial process. In some embodiments, the epitaxial process includes a MOCVD process, a MBE process, a HVPE process or another suitable epitaxial process. In some embodiments, the active layer has a thickness ranging from about 10 nm to about 40 nm. In some embodiments where the active layer includes both AlN and $Al_xGa_{1-x}N$, the AlN layer has a thickness ranging from about 0.5 nm to about 1.5 nm and the $Al_xGa_{1-x}N$ layer has a thickness ranging from about 10 nm to about 40 nm. In some embodiments, the active layer is formed at a temperature ranging from about 1000° C. to about 1200° C.

Figure 5E:
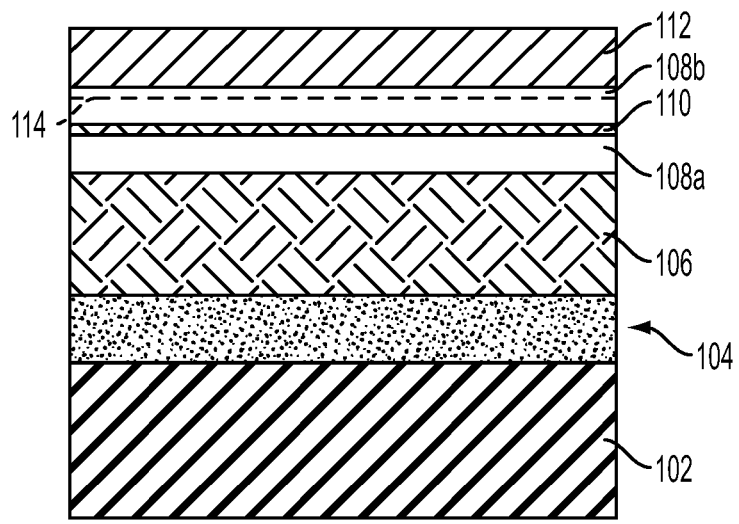

FIG. 5E is a cross-sectional view of a HEMT following operation 414 in accordance with one or more embodiments. The HEMT includes active layer 112 on second portion 108b of the channel layer. 2-DEG 114 is formed in second portion 108b of the channel layer due to the band gap discontinuity between active layer 112 and the second portion of the channel layer.

Returning to FIG. 4, in operation 416 electrodes and a gate are formed on the active layer. The electrodes are formed over the other portion of the channel layer, and the gate is formed over the active layer. In some embodiments, a patterned mask layer (i.e., a photoresistive layer) is formed on the upper surface of the active layer, and an etching process is performed to remove a portion of the active layer to form openings partially exposing an upper surface of the other portion of the channel layer. A metal layer is then deposited over the patterned active layer and fills the openings and contacts the other portion of the channel layer. Another patterned photoresist layer is formed over the metal layer, and the metal layer is etched to form the electrodes over the openings and the gate over the upper surface of the active layer. In some embodiments, the metal layer for forming the electrodes or the gate includes one or more conductive materials. In some embodiments, the electrodes or the gate include one or more layers of conductive materials. In at least one embodiment, the electrodes or the gate include at least one barrier layer contacting the other portion of the channel layer and/or the active layer.

Following operation 416 the HEMT has a similar structure to HEMT 100. If multiple back-barrier layers are formed by repeating operations 410 and 412, the HEMT will have a structure similar to HEMT 300.

Figure 6:
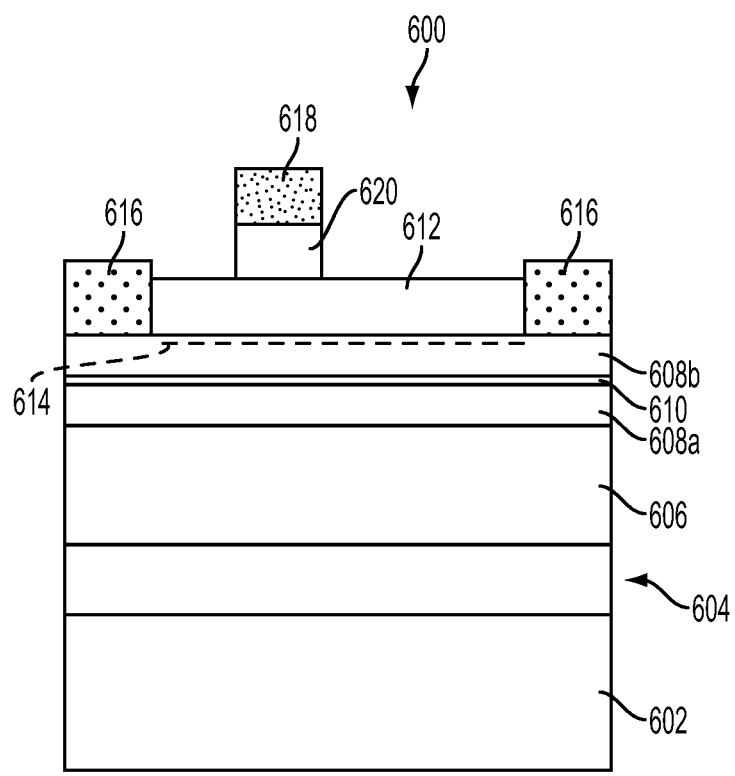
FIG. 6 is a cross-sectional view of an enhanced HEMT (E-HEMT) in accordance with one or more embodiments.

FIG. 6 is a cross-sectional view of an enhanced HEMT (E-HEMT) 600 in accordance with one or more embodiments. E-HEMT 600 is similar to HEMT 100. Similar elements have a same reference number as HEMT 100 increased by 500. In comparison with HEMT 100, E-HEMT 600 includes a semiconductor material 620 between gate 618 and active layer 612. In some embodiments, semiconductor material 620 is a group III-V semiconductor material such as GaN, AlGaN, InGaN, or another suitable group III-V semiconductor material. In some embodiments, semiconductor material 620 is doped with p-type or n-type dopants. In some embodiments, the p-type dopants include carbon, iron, magnesium, zinc or other suitable p-type dopants. In some embodiments, the n-type dopants include silicon, oxygen or other suitable n-type dopants. In comparison with HEMT 100, E-HEMT 600 is normally non-conductive between electrodes 616. As a positive voltage is applied to gate 618, E-HEMT 600 provides an increased conductivity between electrodes 616.

Figure 7:
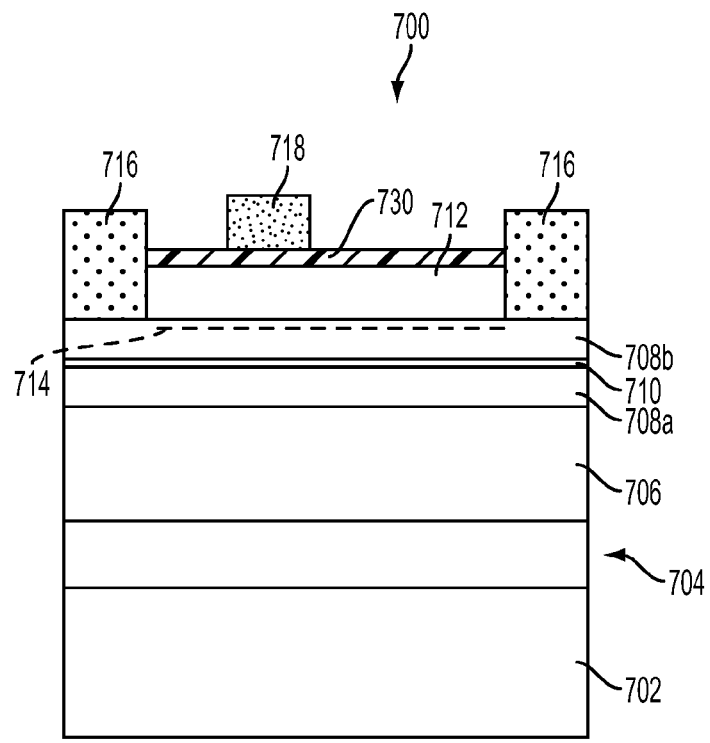
FIG. 7 is a cross-sectional view of a depletion metal-insulator-semiconductor field-effect transistor (D-MISFET) in accordance with one or more embodiments.

FIG. 7 is a cross-sectional view of a depletion metal-insulator-semiconductor field-effect transistor (D-MISFET) 700 in accordance with one or more embodiments. D-MISFET 700 is similar to HEMT 100. Similar elements have a same reference number as HEMT 100 increased by 600. In comparison with HEMT 100, D-MISFET 700 includes a dielectric layer 730 between gate 718 and active layer 712. In some embodiments, dielectric layer 730 includes silicon dioxide. In some embodiments, dielectric layer 730 includes a high-k dielectric layer having a dielectric constant greater than a dielectric constant of silicon dioxide. Similar HEMT 100, D-MISFET 700 is normally conductive between electrodes 716. As a positive voltage is applied to gate 718, D-MISFET 700 provides a decreased conductivity between electrodes 716.

Figure 8:
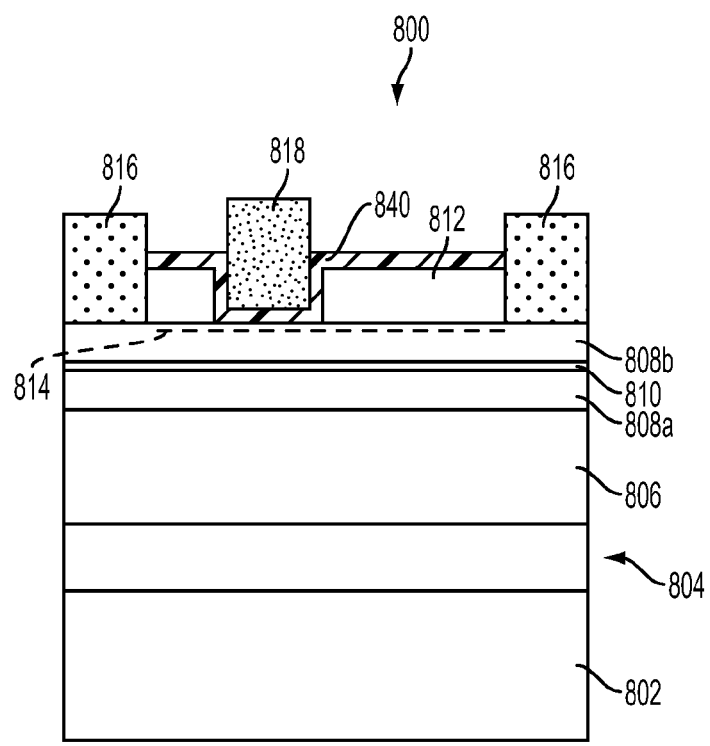
FIG. 8 is a cross-sectional view of an enhanced metal-insulator-semiconductor field-effect transistor (E-MISFET) in accordance with one or more embodiments.

FIG. 8 is a cross-sectional view of an enhanced metal-insulator-semiconductor field-effect transistor (E-MISFET) 800 in accordance with one or more embodiments. E-MISFET 800 is similar to HEMT 100. Similar elements have a same reference number as HEMT 100 increased by 700. In comparison with HEMT 100, E-MISFET 800 gate 818 is in direct contact with second portion 808b of the channel layer. E-MISFET 800 further includes a dielectric layer 840 between gate 818 and second portion 808b of the channel layer. Dielectric layer 840 also separates gate 818 and active layer 812. In some embodiments, dielectric layer 840 includes silicon dioxide. In some embodiments, dielectric layer 840 includes a high-k dielectric layer having a dielectric constant greater than a dielectric constant of silicon dioxide. In comparison with HEMT 100, E-MISFET 800 is normally non-conductive between electrodes 816. As a positive voltage is applied to gate 818, E-MISFET 800 provides an increased conductivity between electrodes 816.

One aspect of this description relates to a transistor. The transistor includes a substrate and a buffer layer on the substrate, wherein the buffer layer comprises p-type dopants. The transistor further includes a channel layer on the buffer layer and a back-barrier layer between a first portion of the channel layer and a second portion of the channel layer. The back-barrier layer has a band gap discontinuity with the channel layer. The transistor further includes an active layer on the second portion of the channel layer, wherein the active layer has a band gap discontinuity with the second portion of the channel layer. The transistor further includes a two dimensional electron gas (2-DEG) in the channel layer adjacent an interface between the channel layer and the active layer.

Another aspect of this description relates to a transistor. The transistor includes a substrate and a gallium nitride (GaN) buffer layer doped with p-type dopants on the substrate. The transistor further includes a GaN channel layer on the GaN buffer layer and a first back-barrier layer in the GaN channel layer. The first back-barrier layer has a band gap discontinuity with the channel layer, and a thickness of the first back-barrier layer ranges from about 1 nanometer (nm) to about 20 nm. The transistor further includes an AlN active layer over the GaN channel layer, wherein the AlN active layer has a band gap discontinuity with the GaN channel layer.

Still another aspect of this description relates to a method of making a transistor. The method includes forming a buffer layer on a substrate, wherein the buffer layer comprises p-type dopants and forming a first portion of a channel layer on the buffer layer. The method further includes forming a back-barrier layer on the first portion of the channel layer, wherein the back-barrier layer has a band gap discontinuity with the first portion of the channel layer. The method further includes forming a second portion of the channel layer on the back-barrier layer and forming an active layer on the second portion of the channel layer, wherein the active layer has a band gap discontinuity with the second portion of the channel layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A transistor comprising:
   a substrate;
   a nucleation layer on the substrate;
   a buffer layer on the nucleation layer, wherein the buffer layer comprises p-type dopants;
   a channel layer on the buffer layer;
   a back-barrier layer between a first portion of the channel layer and a second portion of the channel layer, wherein the back-barrier layer has a band gap discontinuity with the channel layer;
   an active layer on the second portion of the channel layer, wherein the active layer has a band gap discontinuity with the second portion of the channel layer, and the active layer has a first width smaller than a second width of the channel layer; and
   a two dimensional electron gas (2-DEG) in the channel layer adjacent an interface between the channel layer and the active layer, wherein the 2-DEG is between the back-barrier layer and the active layer.

2. The transistor of claim 1, wherein the back-barrier layer comprises aluminum nitride (AlN).

3. The transistor of claim 1, wherein the back-barrier layer comprises aluminum gallium nitride ($Al_xGa_{1-x}N$).

4. The transistor of claim 3, wherein x ranges from about 0.1 to about 0.9.

5. The transistor of claim 1, wherein the back-barrier layer comprises indium aluminum nitride ($In_yAl_{1-y}N$).

6. The transistor of claim 5, wherein y is equal to or greater than 0.5.

7. The transistor of claim 1, wherein a dopant concentration of the p-type dopants in the buffer layer is equal to or greater than $1 \times 10^{19}$ ions/cm$^3$.

8. The transistor of claim 1, wherein the nucleation layer comprises:
   a first seed layer having a first lattice structure;
   a second seed layer on the first seed layer, the second seed layer having a second lattice structure different from the first lattice structure; and
   a graded layer on the second seed layer, the graded layer having a multiple lattice structure.

9. The transistor of claim 1, further comprising:
   a first electrode on the channel layer;
   a second electrode on the channel layer; and,
   a gate between the first electrode and the second electrode, wherein the gate is configured to control a conductivity of the 2-DEG between the first electrode and the second electrode.

10. The transistor of claim 9, wherein the gate is on the active layer, and the transistor is configured to be normally conductive.

11. The transistor of claim 9, further comprising a semiconductor material on the active layer between the first electrode and the second electrode, wherein the gate is on the semiconductor material and the transistor is configured to be normally non-conductive.

12. The transistor of claim 9, further comprising a dielectric layer on the active layer between the first electrode and the second electrode, wherein the gate is on the dielectric layer, and the transistor is configured to be normally conductive.

13. The transistor of claim 9, further comprising:
    an opening in the active layer between the first electrode and the second electrode;
    a dielectric layer on the active layer and lining the opening, wherein the gate is on the dielectric layer in the opening, and the transistor is configured to be normally non-conductive.

14. A transistor comprising: a substrate;
    a gallium nitride (GaN) buffer layer on the substrate, wherein an entirety of the GaN buffer layer comprises p-type dopants;
    a GaN channel layer on the GaN buffer layer;
    a first back-barrier layer in the GaN channel layer, wherein the first back-barrier layer has a band gap discontinuity with the channel layer, and a thickness of the first back-barrier layer ranges from about 1 nanometer (nm) to about 20 nm; and
    an AlN active layer over the GaN channel layer, wherein the AlN active layer has a band gap discontinuity with the GaN channel layer, and wherein the AlN active layer is in direct contact with the GaN channel layer.

15. The transistor of claim 14, wherein the first back-barrier layer comprises AlN and the thickness of the back-barrier layer ranges from about 1 nm to about 6 nm.

16. The transistor of claim 14, wherein the first back-barrier layer comprises a complex structure comprising a layer of AlN and a layer of aluminum gallium nitride ($Al_xGa_{1-x}N$).

17. The transistor of claim 14, further comprising a second back-barrier layer in the GaN channel layer, wherein a portion of the channel layer is between the first back-barrier layer and the second back-barrier layer.

18. A method of making a transistor, the method comprising:
    forming a buffer layer on a substrate, wherein an entirety of the buffer layer comprises p-type dopants;
    forming a first portion of a channel layer on the buffer layer;
    forming a back-barrier layer on the first portion of the channel layer, wherein the back-barrier layer has a band gap discontinuity with the first portion of the channel layer;
    forming a second portion of the channel layer on the back-barrier layer; and
    forming an active layer on the second portion of the channel layer, wherein the active layer has a band gap discontinuity with the second portion of the channel layer to define a two-dimension electron gas (2-DEG) layer at an interface of the active layer and the channel layer, wherein a longest horizontal distance of the active layer is smaller than a longest horizontal distance of the first portion of the channel layer, and the 2-DEG layer is between the back-barrier layer and the active layer.

19. The method of claim 18, wherein forming the back-barrier layer comprises forming an aluminum nitride (AlN) layer having a thickness ranging from about 1 nanometer (nm) to about 6 nm.

20. The method of claim 18, wherein forming the back-barrier layer comprises forming an aluminum gallium nitride ($Al_xGa_{1-x}N$) layer having a thickness ranging from about 0.1 nm to about 20 nm.

* * * * *